United States Patent
Kuo et al.

(10) Patent No.: US 6,277,727 B1
(45) Date of Patent: Aug. 21, 2001

(54) METHOD OF FORMING A LANDING PAD ON A SEMICONDUCTOR WAFER

(75) Inventors: Chien-Li Kuo; Jung-Chao Chiou, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/421,247

(22) Filed: Oct. 20, 1999

(51) Int. Cl.[7] ............................................... H01L 21/4763
(52) U.S. Cl. ...................... 438/618; 438/253; 438/396; 438/596; 438/612; 438/631; 438/639; 438/647
(58) Field of Search ................................. 438/618, 612, 438/396, 657, 631, 253, 596, 639, 647

(56) References Cited

U.S. PATENT DOCUMENTS

| Re. 36,398 | * | 10/2000 | Chan et al. | 438/612 |
| 5,622,883 | * | 4/1997 | Kim | 438/396 |
| 6,080,666 | * | 6/2000 | Lee et al. | 438/657 |
| 6,117,757 | * | 9/2000 | Wang et al. | 438/596 |
| 6,121,082 | * | 9/2000 | Linlin et al. | 438/253 |
| 6,150,217 | * | 11/2000 | Chang et al. | 438/255 |
| 6,156,608 | * | 12/2000 | Chen | 438/253 |
| 6,159,843 | * | 12/2000 | Lin | 438/631 |

OTHER PUBLICATIONS

NB9306413, IBM Technical Disclosure Bulletin, Jun. 1993, vol. 36, No. 6B pp. 413–416.*

* cited by examiner

Primary Examiner—Matthew Smith
Assistant Examiner—Belur V Keshaven
(74) Attorney, Agent, or Firm—Winston Hsu (57) ABSTRACT

This invention relates to a method of forming a landing pad on a semiconductor wafer comprising a silicon substrate, a dielectric layer, a passivation layer and a photo-resist layer. The photo-resist layer comprises a hole penetrating to the surface of the passivation layer which defines the position of the landing pad. An anisotropic etching through the hole is performed to vertically remove the passivation layer and a predetermined thickness of the dielectric layer under the hole to form a recess, and then the photo-resist layer is removed. A filling layer is deposited on the passivation layer and the recess. An etch-back process is performed to remove the filling layer on the bottom portion of the recess and form a circular spacer on the surrounding portion of the recess. Another anisotropic etching is performed to vertically remove the dielectric layer under the recess and down to the surface of the silicon substrate which forms a plug hole, over which the circular spacer is used as a hard mask. Lastly, a conductive layer is deposited to completely fill the recess and the plug hole which forms the landing pad.

8 Claims, 8 Drawing Sheets

METHOD OF FORMING A LANDING PAD ON A SEMICONDUCTOR WAFER

BACKGROUND OF THE INVENTION

1. Field of the Invention

The present invention relates to a semiconductor process, and more particularly, to a method of forming a landing pad on a semiconductor wafer.

2. Description of the Prior Art

The dynamic random access memory (DRAM) comprises a MOS transistor, a capacitor and a contact plug. The MOS transistor is used for transferring the electric charge, the capacitor is used for storing the charge to memorize information, and the contact plug is used as a node contact to electrically connect the MOS transistor and the capacitor. As devices of the semiconductor become smaller, the process for forming a contact hole to define the position of the contact plug becomes more difficult. Therefore, a landing pad is formed on the contact plug to ensure the connection between the contact plug and other devices.

Figure 1:
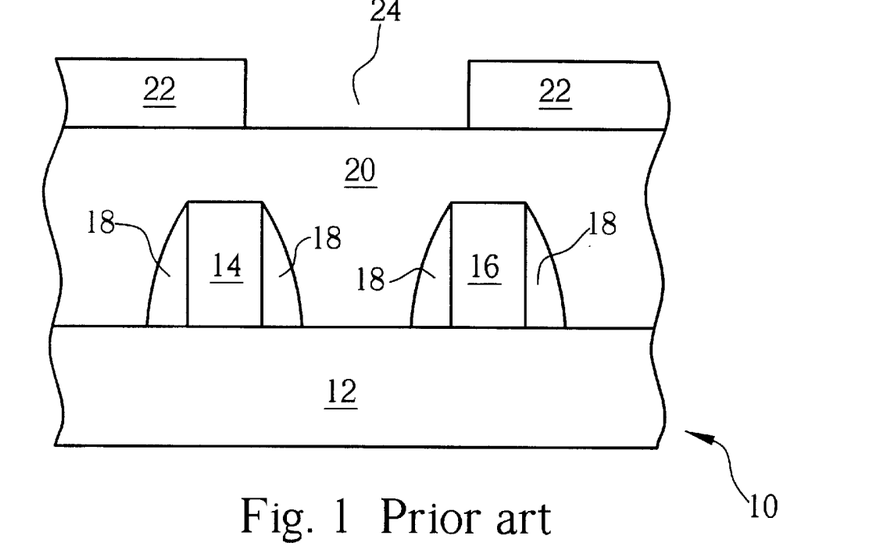
FIG. 1 to FIG. 3 are the schematic diagrams of a prior ar method of forming a landing pad.
Figure 2:
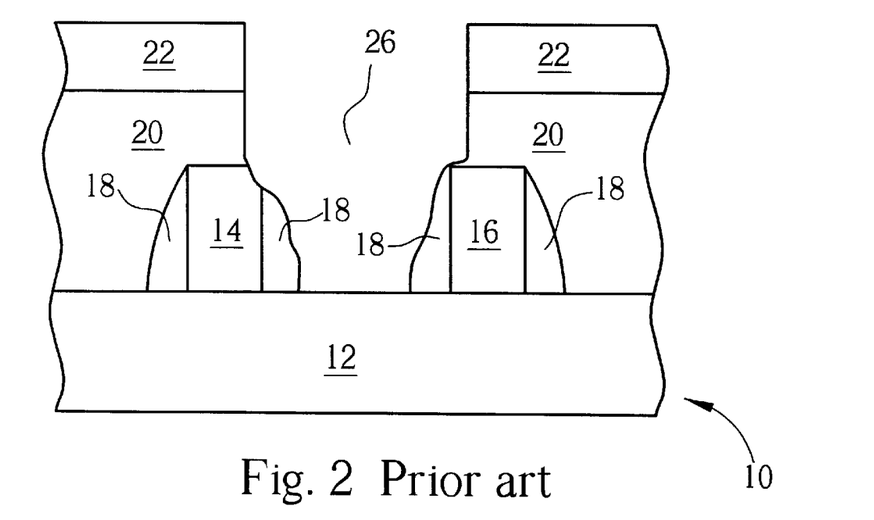
Figure 3:
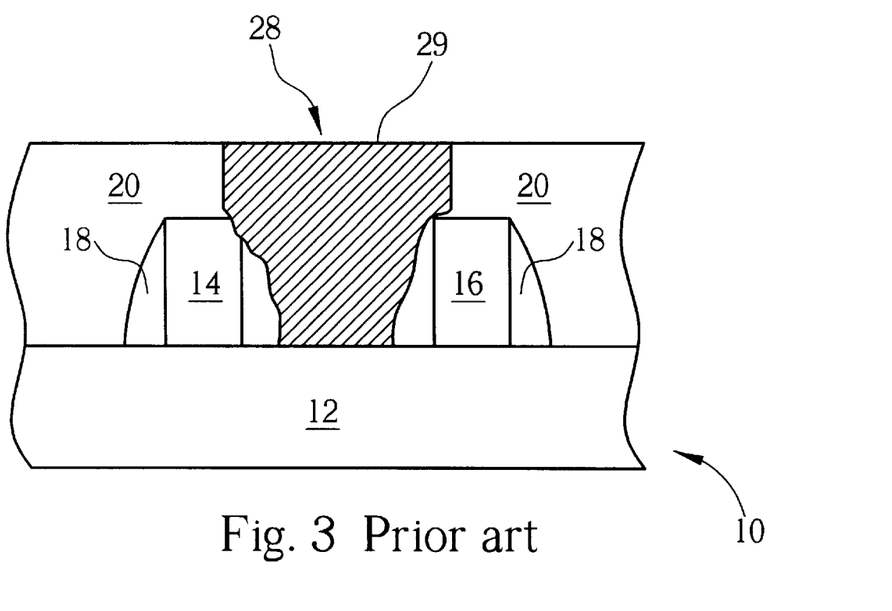

Please refer to FIG. 1 to FIG. 3. FIG. 1 to FIG. 3 are the schematic diagrams of a prior art method of forming a landing pad 29. The prior art method of forming the landing pad 29 is performed on a semiconductor wafer 10. As shown in FIG. 1, the semiconductor wafer 10 comprises a silicon substrate 12, a dielectric layer 20 made of silicon oxide positioned on the silicon substrate 12, and a photo-resist layer 22 positioned on the dielectric layer 20. The dielectric layer 20 comprises a first gate 14 and a second gate 16 within the dielectric layer 20, and each of the gates 14 and 16 is surrounded by a spacer 18 made of silicon nitride. The photo-resist layer 22 comprises a hole 24 that penetrates to the surface of the dielectric layer 20 to define the position of the landing pad 29.

In the formation of the landing pad 29 according to the prior art method, an anisotropic etching process is performed to vertically remove the dielectric layer 20 in the bottom of the hold 24 to form a contact hole 26, as shown in FIG. 2. Next, a photo-resist stripping process is performed to remove the photo-resist layer 22 on the semiconductor wafer 10. Lastly, a conductive layer 28 is deposited in the contact hole 26 to completely fill the contact hole 26, as shown in FIG. 3. The bottom portion of the conductive layer 28 is used as a contact plug and the top portion of the conductive layer 28 is used as the landing pad 29.

The dielectric layer 20 is made of silicon oxide, while the spacer 18 is made of silicon nitride. During the etching process, the etching selectivity ratio of silicon nitride to silicon oxide is very difficult to be adjusted to the optimal condition. So the surfaces of the first and second gates 14, 16 and the spacers 18 will easily get damaged. Therefore the landing pad 29 will be formed at a position very close to the first and second gates 14, 16, which will cause an increase in the electrical coupling effect and affect the electrical performance of the semiconductor wafer 10.

Figure 4:
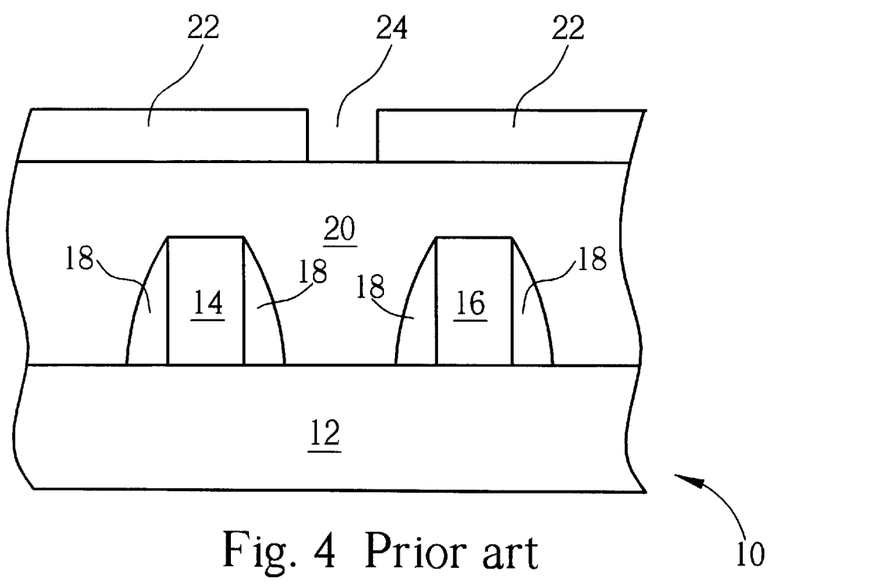
FIG. 4 to FIG. 8 are schematic diagrams of another prior method of forming a landing pad.

Please refer to FIG. 4 to FIG. 8. FIG. 4 to FIG. 8 are schematic diagrams of another prior method of forming a landing pad 29. Another prior method of forming landing pad 29 is performed on a semiconductor wafer 10 using a first and a second photo-resist layers 22,27 to define the position of the landing pad 29 and the contact plug. As shown in FIG. 4, the semiconductor wafer 10 comprises a silicon substrate 12, a dielectric layer 20 positioned on the silicon substrate 12 and a first photo-resist layer 22 positioned on the dielectric layer 20. The dielectric layer 20 comprises a first gate 14 and a second gate 16, and each of the first gate 14 and the second gate 16 is surrounded by a spacer 18 made of silicon nitride. The photo-resist layer 22 comprises a hole 24 that penetrates to the surface of the dielectric layer 20 to define the position of the landing pad 29.

Figure 5:
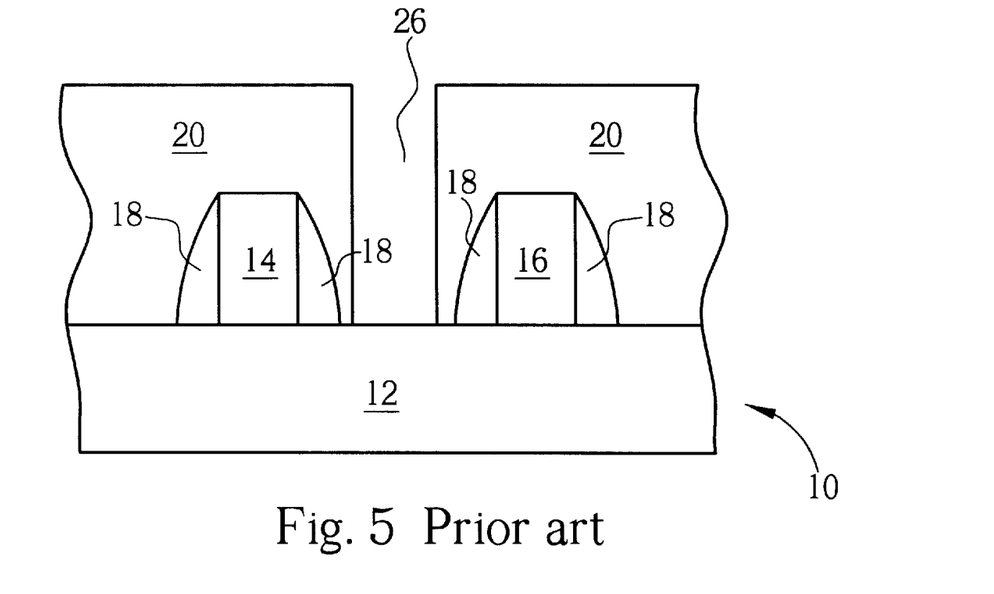
Figure 6:
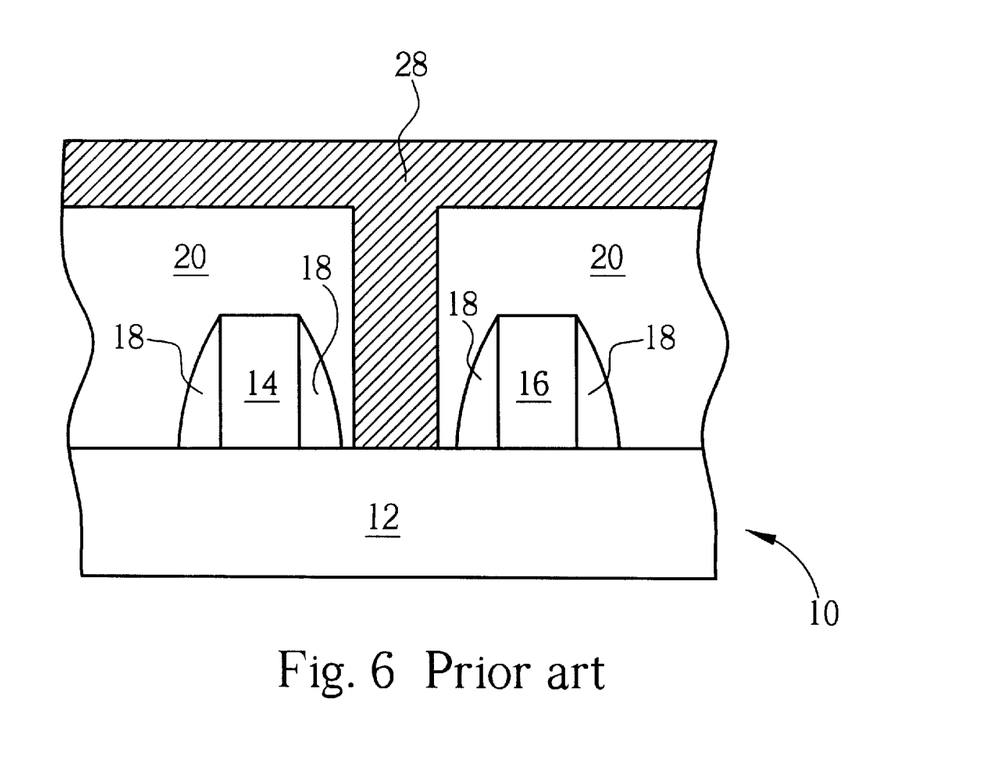
Figure 7:
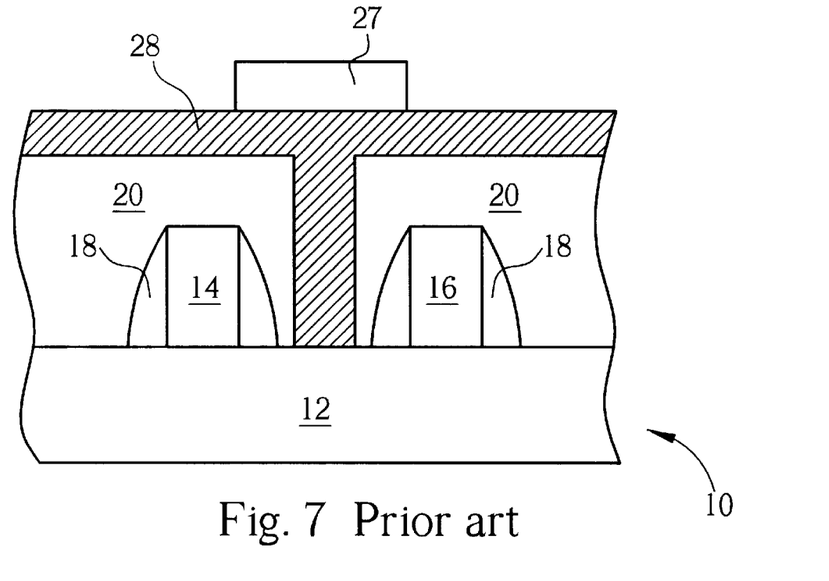
Figure 8:
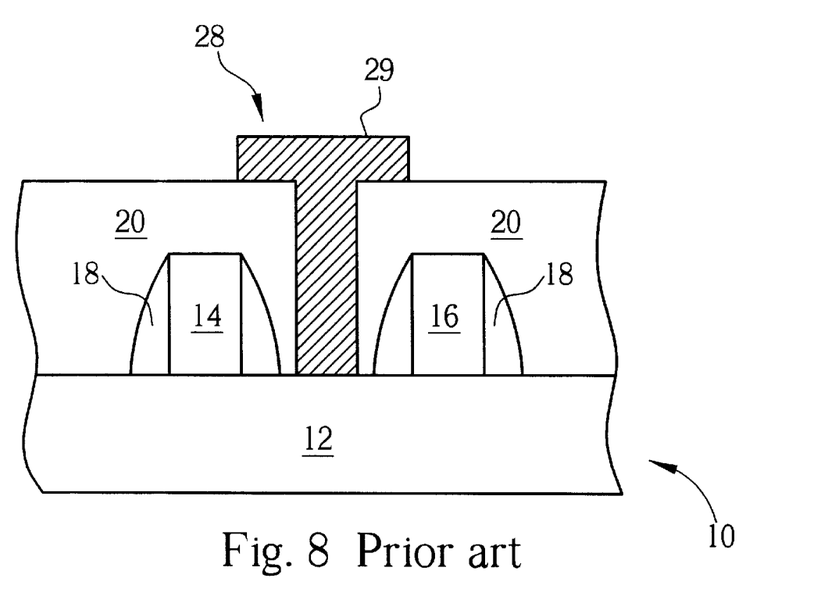

In the formation of the landing pad 29 in this method, an anisotropic etching process is performed to vertically remove the dielectric layer 20 in the bottom of the hold 24 to form a contact hole 26, as shown in FIG. 5. Next, a photo-resist stripping process is performed to remove the first photo-resist layer 22 from the semiconductor wafer 10. Then, a conductive layer 28 is deposited in the contact hole 26 to completely fill the contact hole 26, as shown in FIG. 6. Afterward, a second photo-resist layer 27 is formed in a predetermined region on the semiconductor wafer 10 to define the position of the landing pad 29, as shown in FIG. 7. Lastly, the conductive layer 28 not covered by the second photo-resist layer 27 is removed to complete the formation of the landing pad 29, as shown in FIG. 8. The bottom portion of the conductive layer 28 is used as a contact plug and the top portion of the conductive layer 28 is used as the landing pad 29.

By using the first photo-resist layer 22 to define the position of the contact hole 26 can prevent the surface of the first and second gate 14, 16 and the spacer 18 from being damaged and prevent the increase in the electric coupling effect. However, the physical limitation will still increase the difficulty of the procedure. In order to define a smaller contact hole in aligning with the space between the two spacers 18 of the first gate and the second gate 16, 14, an advanced align machine is needed. But this will increase the process cost.

SUMMARY OF THE INVENTION

It is therefore a primary objective of the present invention to provide a method of forming a landing pad on a semiconductor wafer to solve the above-mentioned problem.

In a preferred embodiment, the present invention relates to a method of forming a landing pad on a semiconductor wafer. The semiconductor wafer comprises a silicon substrate, a dielectric layer on the silicon substrate, a passivation layer on the dielectric layer and a photo-resist layer on the passivation layer. The photo-resist layer comprises a hole penetrating to the surface of the passivation layer which defines the position of the landing pad. The method comprises:

performing a first anisotropic etching process through the hole to vertically remove the passivation layer and a predetermined thickness of the dielectric layer under the hole to form a recess;

performing a photo-resist stripping process to remove the photo-resist layer on the semiconductor wafer;

performing a deposition process to form a filling layer on the surface of the passivation layer and the recess;

performing an etch-back process to remove the filling layer on the bottom portion of the recess and partially remove the filling layer on the surrounding portion of the recess which forms a circular spacer on the surrounding portion of the recess;

performing a second anisotropic etching process to vertically remove the dielectric layer under the recess and down to the surface of the silicon substrate which forms a plug hole, over which the spacer surrounding the recess is used as a hard mask during the second anisotropic etching process; and depositing a conductive layer in the recess and the plug hole to completely fill the recess and the plug hole which forms the landing pad.

It is an advantage of the present invention that only one photo-resist layer is needed to define the position of the landing pad and the increase in the electrical coupling effect caused by a small space between the landing pad and the gate can be avoided.

These and other objective of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 9:
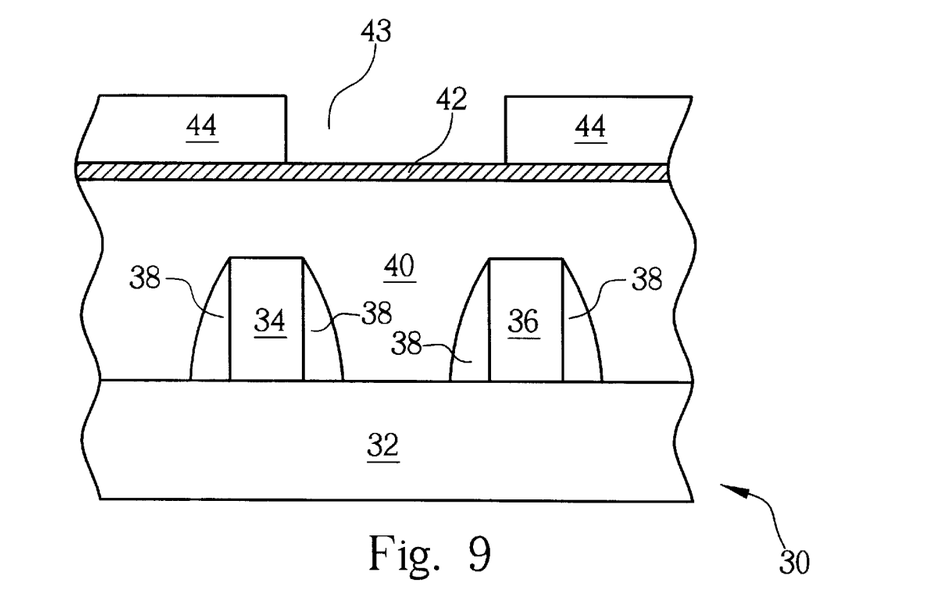
FIG. 9 to FIG. 15 are schematic diagrams of a method of forming a landing pad according to the present invention.

Please refer to FIG. 9 to FIG. 15. FIG. 9 to FIG. 15 are schematic diagrams of a method of forming a landing pad according to the present invention. The present invention relates to a method of forming a landing pad on a semiconductor wafer 30 for electrically connecting the transistor and the capacitor of a DRAM. As shown in FIG. 9, the semiconductor wafer 30 comprises a silicon substrate 32, a dielectric layer 40 made of silicon oxide positioned on the silicon substrate 32, a passivation layer 42 made of silicon nitride positioned on the dielectric layer 40, and a photo-resist layer 44 positioned on the passivation layer 42. The dielectric layer 40 comprises a first gate 34 and a second gate 36 within the dielectric layer 40. Each of the first gate 34 and the second gate 36 is surrounded by a spacer 38 made of silicon nitride. The photo-resist layer 44 comprises a hole 43 that penetrates to the surface of the passivation layer 42 to define the position of the landing pad.

Figure 10:
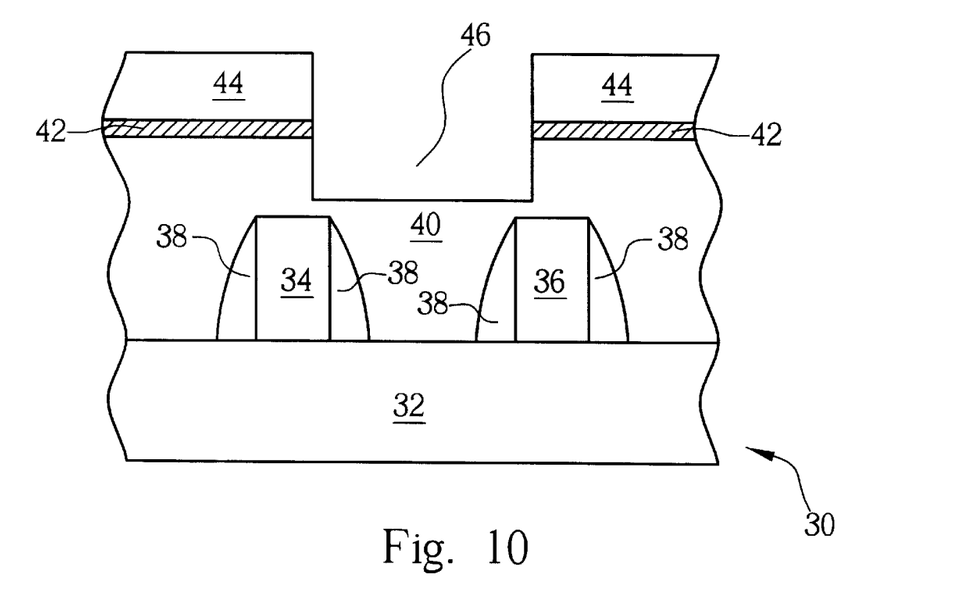
Figure 11:
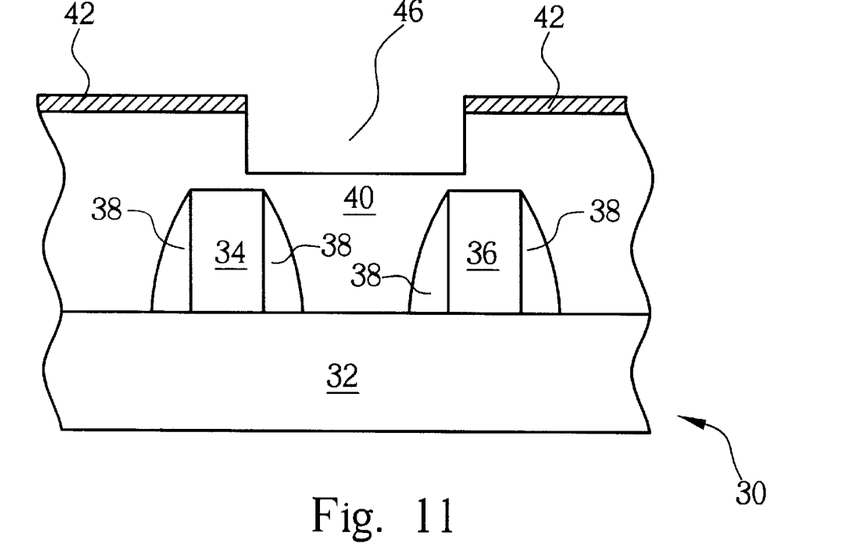
Figure 12:
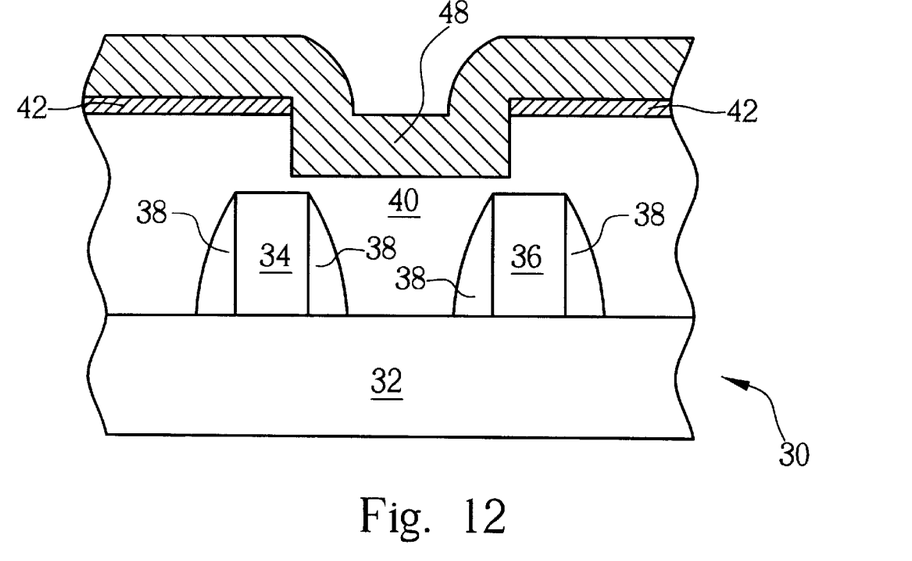
Figure 13:
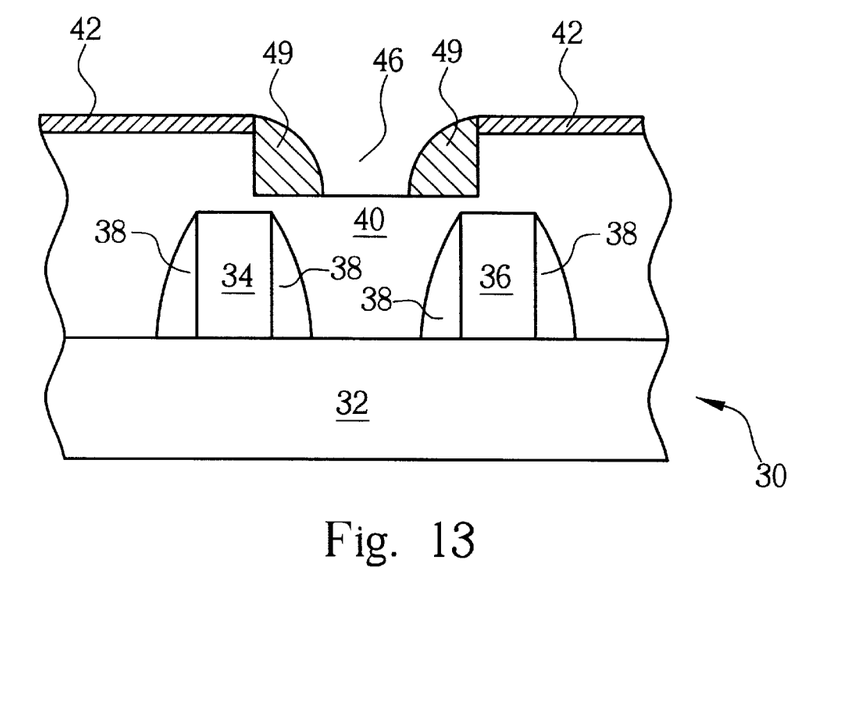

In the method of the present invention, a first etching process through the hole 43 is first performed to vertically remove the passivation layer 42 and a predetermined thickness of the dielectric layer 40 under the hole 43 to form a recess 46, as shown in FIG. 10. Then, a photo-resist stripping process is performed to remove the photo-resist layer 44 on the semiconductor wafer 30, as shown in FIG. 11. Next, a deposition process is performed to form a filling layer 48 on the surface of the passivation layer 42 and the recess 46, as shown in FIG. 12. Afterward, an etch-back process is performed to remove the filling layer 48 on the bottom portion of the recess 46 and partially remove the filling layer 48 on the surrounding portion of the recess 46 which forms a circular spacer 49 on the surrounding portion of the recess 46, as shown in FIG. 13.

Figure 14:
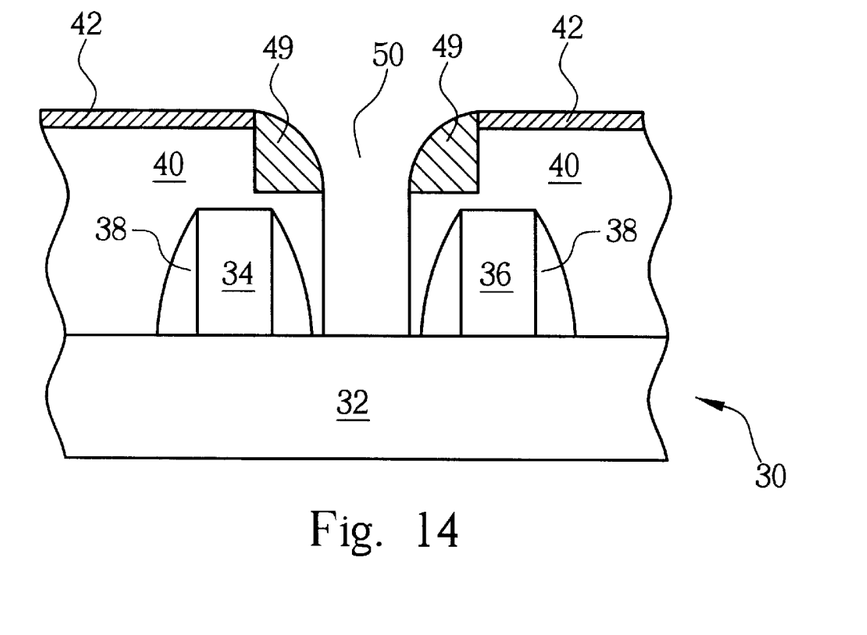
Figure 15:
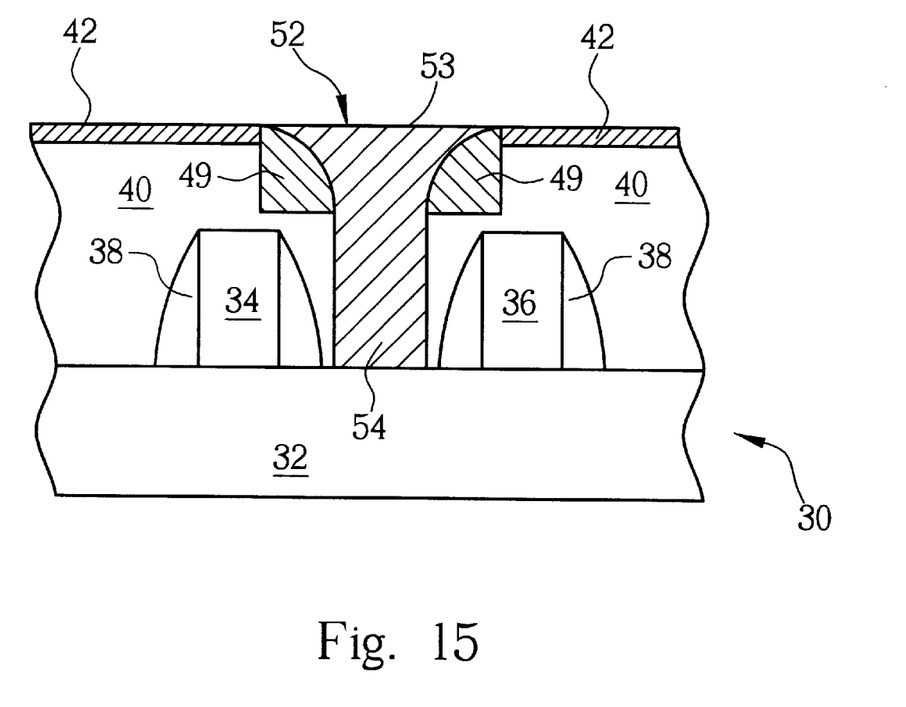

Then, a second anisotropic etching process is performed to vertically remove the dielectric layer 40 under the recess 46 and down to the surface of the silicon substrate 32 which forms a plug hole 50, over which the spacer 49 and the passivation layer 42 surrounding the recess 46 is used as a hard mask during the second anisotropic etching process, as shown in FIG. 14. Next, a conductive layer 52 made of polysilicon is deposited on the surface of the passivation layer 42 and filling the recess 46 and the plug hole 50. Lastly, an etch-back process or a chemical mechanical polishing process is performed to completely remove the conductive layer 52 on the passivation layer 42 over which the top end of the conductive layer 52 in the recess 46 and the passivation layer 42 is approximately leveled with the surface of the passivation layer 42, as shown in FIG. 15. The bottom portion of the conductive layer 52 is used as a contact plug 54 and the top portion of the conductive layer 52 is used as the landing pad 53.

In the method of the present invention, only one photo-resist layer is need to define the position of the landing pad 53, so the process cost may be reduced. Besides, during the second anisotropic etching process, the spacer 49 and the passivation layer 42 surrounding the recess 46 are used as a hard mask to define the position of the contact plug 50 in the center portion of the hole 43 of the photo-resist 44. Therefore, the space between the subsequent conductive layer 52 formed in the contact plug 50 and the first and second gate 34, 36 can be increased, and the electric coupling effect between the landing pad 53 and the first and second gates 34,36 can be reduced. Since, the spacer 49 is made of polysilicon so that the spacer 49 can establish a strong bonding with the subsequently formed conductive layer 52 in the recess 46 and the plug hole 50 which forms the landing pad 53 with good electric conductivity.

In contrast to the prior art, the method of forming the landing pad 53 is to remove a predetermined thickness of the dielectric layer 40 to form the recess 46, then form the spacer 49 on the surrounding portion of the recess 46, using the spacer 49 as the hard mask to form the contact hole. Since the first gate 34, the second gate 36 and the spacers 38 will not get damaged during the etching process, the electric coupling effect between the landing pad 53 and the first and second gate 34,36 can be reduced and the electric performance of the semiconductor wafer 30 can be ensured. Furthermore, only one photo-resist layer is needed to define the position of the landing pad 53 in the invention method, hence the process cost may be reduced.

These skilled in the art will readily observe that numerous modifications and alterations of the device may be made while retaining the teachings of the invention. Accordingly, the above disclosure should be construed as limited only by the metes and bounds of the appended claims.

What is claimed is:

1. Method of forming a landing pad on a semiconductor wafer, the semiconductor wafer comprising a silicon substrate, a dielectric layer on the silicon substrate, a passivation layer on the dielectric layer and a photo-resist layer on the passivation layer, the photo-resist layer comprising a hole penetrating to the surface of the passivation layer which defines the position of the land pad, the method comprising:

performing a first anisotropic etching process through the hole to vertically remove the passivation layer and a predetermined thickness of the dielectric layer under the hole to form a recess;

performing a photo-resist stripping process to remove the photo-resist layer on the semiconductor wafer;

performing a deposition process to form a filling layer on the surface of the passivation layer and the recess;

performing an etch-back process to remove the filling layer on the bottom portion of the recess and partially remove the filling layer on the surrounding portion of the recess which forms a circular spacer on the surrounding portion of the recess;

performing a second anisotropic etching process to vertically remove the dielectric layer under the recess and down to the surface of the silicon substrate which forms a plug hole, over which the spacer surrounding the recess is used as a hard mask during the second anisotropic etching process; and depositing a conductive layer in the recess and the plug hole to completely fill the recess and the plug hole which forms the landing pad.

2. The method of claim 1 wherein the filling layer on the surface of the passivation layer is also removed in the etch-back process, and when performing the second anisotropic etching process, the passivation layer and the circular spacer surrounding the recess are used as the hard-mask of the second anisotropic etching process.

3. The method of claim 2 wherein the method of forming the conductive layer in the recess and the plug hole comprises:

depositing the conductive layer on the surface of the passivation layer and filling the recess and the plug hole; and performing an etch-back process or a chemical mechanical polishing process to completely remove the conductive layer on the passivation layer over which the top end of the conductive layer in the recess and the passivation layer is approximately leveled with the surface of the passivation layer.

4. The method of claim 2 wherein the conductive layer is made of polysilicon.

5. The method of claim 4 wherein the filling layer is also made of polysilicon so that the spacer made by using the filling layer can establish a strong bonding with the subsequently formed conductive layer in the recess and the plug hole which forms the landing pad with good electric conductivity.

6. The method of claim 1 wherein the dielectric layer is made of silicon oxide.

7. The method of claim 1 wherein the passivation layer is made of silicon nitride.

8. The method of claim 1 wherein the landing pad is used for electrically connecting a transistor and a capacitor in a memory cell of a DRAM.

* * * * *